(12) United States Patent
Sandhu et al.

(10) Patent No.: US 7,052,972 B2
(45) Date of Patent: May 30, 2006

(54) METHOD FOR FORMING SUBLITHOGRAPHIC FEATURES DURING THE MANUFACTURE OF A SEMICONDUCTOR DEVICE AND A RESULTING IN-PROCESS APPARATUS

(75) Inventors: Sukesh Sandhu, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 77 days.

(21) Appl. No.: 10/742,174

(22) Filed: Dec. 19, 2003

(65) Prior Publication Data

US 2005/0136675 A1     Jun. 23, 2005

(51) Int. Cl.
*H01L 21/76*    (2006.01)
(52) U.S. Cl. ........................... 438/445; 438/700
(58) Field of Classification Search ............ 438/445, 438/700
See application file for complete search history.

(56) References Cited

U.S. PATENT DOCUMENTS

| | | | |
|---|---|---|---|
| 5,750,441 A | 5/1998 | Figura et al. | 438/751 |
| 6,033,952 A | 3/2000 | Yasumura et al. | 438/253 |
| 6,262,450 B1 * | 7/2001 | Kotecki et al. | 257/306 |
| 6,383,952 B1 | 5/2002 | Subramanian et al. | 438/781 |
| 6,500,756 B1 * | 12/2002 | Bell et al. | 438/639 |
| 6,534,243 B1 | 3/2003 | Templeton et al. | 430/312 |
| 6,566,280 B1 | 5/2003 | Meagley et al. | 438/780 |

OTHER PUBLICATIONS

Kanda et al., "100nm contact holes using resolution enhancement lithography assisted by chemical shrint", Microlithography World, vol. 8, No. 4, pp. 26-27 (Autumn 1999).

Copending Application: "Boron-Doped Amorphous Carbon Film For Use as a Hard Etch Mask During the Formation of a Semiconductor Device", U.S. Appl. No. 10/463,185, Filed Jun. 17, 2003.

Copending Application: "Antireflective Coating For Use During the Manufacture of a Semiconductor Device", U.S. Appl. No. 10/671,186, Filed Sep. 24, 2003.

* cited by examiner

*Primary Examiner*—W. David Coleman
(74) *Attorney, Agent, or Firm*—Kevin D. Martin

(57) ABSTRACT

A method for forming a semiconductor device comprises forming a layer to be etched, then forming a hard mask layer over the layer to be etched. The hard mask is etched to form an opening defined by first and second cross-sectional sidewalls in the hard mask layer. In one embodiment, the opening in the hard mask layer is formed at the minimum limits allowable by optical lithography. A conformal spacer layer is formed over the hard mask layer and on the sidewalls of the hard mask, then spacer etched to form first and second cross-sectional spacers along the first and second sidewalls in the patterned hard mask layer. The hard mask and spacers are preferably formed from amorphous carbon. The layer to be etched is etched using the hard mask layer and the spacers as a pattern, then the hard mask layer and spacers are removed.

10 Claims, 12 Drawing Sheets

METHOD FOR FORMING SUBLITHOGRAPHIC FEATURES DURING THE MANUFACTURE OF A SEMICONDUCTOR DEVICE AND A RESULTING IN-PROCESS APPARATUS

FIELD OF THE INVENTION

This invention relates to the field of semiconductor manufacture and, more particularly, to a method for forming a device feature which is smaller than the lithography which defines it.

BACKGROUND OF THE INVENTION

During the manufacture of a semiconductor device, features are commonly patterned using optical lithography (photolithography). An exemplary photolithographic method and formation of a digit line contact is depicted in FIGS. 1–4. FIG. 1 depicts a conductively-doped diffusion region 10 within a semiconductor wafer 12, and a dielectric layer 14 such as borophosilicate glass (BPSG) formed over the wafer surface. A photoresist (resist) layer 16 is formed on the dielectric layer 14, then the photoresist layer is exposed and the exposed portion is removed to result in the structure of FIG. 1. The dielectric layer is etched using the resist 16 as a mask to form an opening 20 in the dielectric layer 14 to expose region 10 within semiconductor wafer 12 to result in the structure of FIG. 2. Next, the photoresist layer is removed and at least one metal layer 30 is deposited over the surface of the dielectric layer 14 and within the opening to result in the structure of FIG. 3. Finally, the metal layer 30 is planarized using mechanical polishing such as chemical mechanical polishing (CMP) to remove the metal layer 30 from the upper surface of the dielectric layer 14 and to form a digit line contact plug 32. A conductive line 40 is formed as depicted in FIG. 4 to electrically connect the plug 32 with peripheral circuitry (not depicted).

A continual design goal during the manufacture of semiconductor devices is to produce smaller features. One limit to this goal is the deficiencies in optical lithography which restrict the minimum feature size. This minimum for feature sizes results from various optical properties of the photolithographic process. With the structure of FIGS. 1–4, it is often desirable to form opening 20 as narrowly as possible so that features can be formed within a minimum perimeter.

FIG. 5 depicts an isometric view of a conventional flash memory device comprising a semiconductor wafer 12 having implanted source 50 and drain 52 regions with a channel region 53 between the source and drain regions. FIG. 5 further depicts transistor gate stacks 54 comprising gate (tunnel) oxide 56 formed under transistor floating gates 58, a capacitor dielectric layer 60 typically comprising a layer of silicon nitride interposed between two silicon dioxide layers, a word line (control gate) 62, and a silicon nitride capping layer 64. Prior to forming floating gates 58 and control gates 62, long, narrow trenches are etched into the wafer which extend across the wafer. A first portion 74 and a second portion 76 of a trench are depicted. The second trench portion 76 is filled with oxide 78 between adjacent drain regions 52. Oxide 80 also remains under the control gate 62. Spacers 82 are formed to electrically isolate the word line 62 from the floating gate 58.

FIGS. 6 and 7 are cross sections depicting a method used for forming the FIG. 5 structure. The cross sections of FIGS. 6 and 7 are generally taken along A—A of the completed structure of FIG. 5. FIG. 6 depicts semiconductor wafer 12, gate oxide 56, polysilicon floating gate layer 58, capacitor dielectric 60, and patterned photoresist layer 16. With this embodiment, the spacing between photoresist portions 16 is at the limit of optical lithography, typically about 0.08 microns. The capacitor dielectric 60, floating gate layer 58, and at least a portion of the gate oxide 56 are etched. The resist 16 is removed and a blanket spacer layer is formed then etched to result in spacers 82. Blanket layers of word line polysilicon and capping layers are formed and then patterned to result in the word line 62 and capping layer 64 as depicted in FIG. 7.

With the structure of FIGS. 5–7, it is desirable to form the floating gates along a word line as closely as possible. This allows the floating gates to be maximized to provide a maximum capacitive coupling between the floating gate and the control gate, and still provides a sufficient density of transistors. Trenches 74 are formed prior to forming the floating gates at a width corresponding to the distance between the floating gates, which is determined by the limits of optical lithography. The floating gates are formed in this direction during an etch of a blanket layer which separates the floating gate layer into a plurality of individual strips, and the individual floating gates are defined during the etch which defines the word lines.

A method for forming a semiconductor device which allows for the definition of features smaller than those available with the limitations of optical lithography would be desirable.

SUMMARY OF THE INVENTION

The present invention provides a new method which, among other advantages, allows for a reduction in the size of features formed using an optical lithographic process. In accordance with one embodiment of the invention a hard mask layer and a dielectric antireflective coating (DARC) layer are formed over a dielectric layer, and a patterned photoresist layer is formed on the DARC layer. Amorphous carbon is preferred for the hard mask layer. The photoresist layer comprises an opening over a location of the dielectric layer which is to be etched. The opening is formed in the photoresist layer at the minimum size allowed by the optical lithography. The DARC layer and the hard mask layer are etched to form an opening in the hard mask layer which corresponds to the size of the opening in the photoresist layer, then the photoresist layer is removed and a blanket conformal spacer layer is formed over hard mask layer and on the dielectric layer. Amorphous carbon is preferred for the spacer layer. A vertical anisotropic etch is performed on the spacer layer which leaves spacers along sidewalls of the hard mask layer, thereby effectively narrowing the opening in the hard mask layer. Finally, the dielectric is etched to form an opening in the dielectric. Because of the spacers, the opening in the dielectric is narrower than the opening originally formed at minimum spacing in the photoresist.

Additional advantages will become apparent to those skilled in the art from the following detailed description read in conjunction with the appended claims and the drawings attached hereto.

It should be emphasized that the drawings herein may not be to exact scale and are schematic representations. The drawings are not necessarily intended to portray the specific parameters, materials, particular uses, or the structural details of the invention, which can be determined by one of skill in the art by examination of the information herein.

DETAILED DESCRIPTION OF THE PREFERRED EMBODIMENT

The term "wafer" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" in the following description, previous process steps may have been utilized to form regions or junctions in or over the base semiconductor structure or foundation. Additionally, when reference is made to a "substrate assembly" in the following description, the substrate assembly may include a wafer with layers including dielectrics and conductors, and features such as transistors, formed thereover, depending on the particular stage of processing. In addition, the semiconductor need not be silicon-based, but could be based on silicon-germanium, silicon-on-insulator, silicon-on-sapphire, germanium, or gallium arsenide, among others. Further, in the discussion and claims herein, the term "on" used with respect to two layers, one "on" the other, means at least some contact between the layers, while "over" means the layers are in close proximity, but possibly with one or more additional intervening layers such that contact is possible but not required. Neither "on" nor "over" implies any directionality as used herein.

A first embodiment of an inventive method for forming a feature in a semiconductor device is depicted in FIGS. 8–13, which specifically depict an embodiment of the invention used to form a digit line contact. It should be noted that various other structures may also be present in the device represented by the present FIGS. which are not immediately germane to the present invention and which, for simplicity of explanation, are not depicted.

Figure 8:
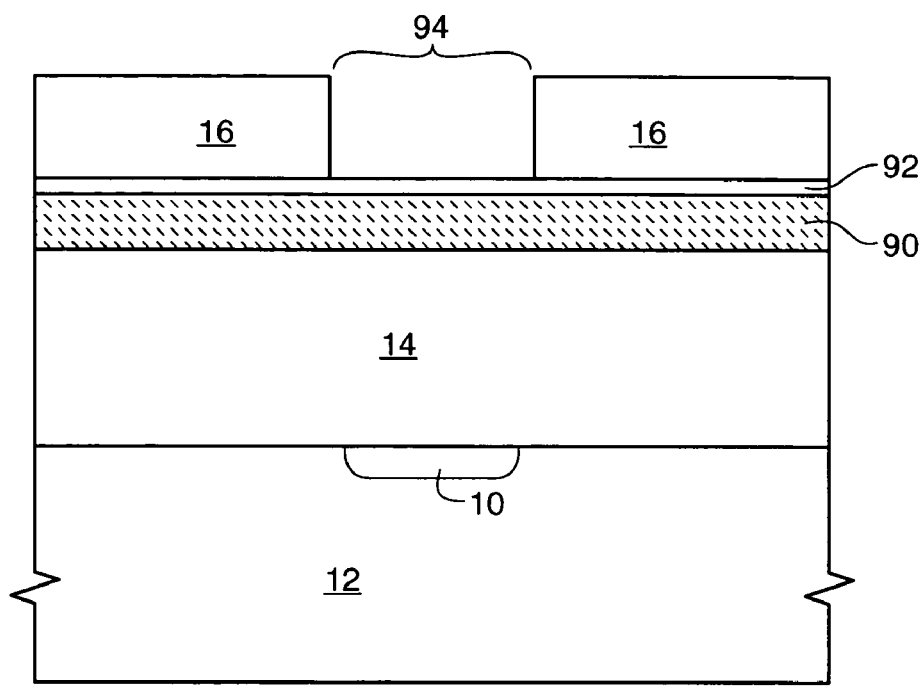
FIGS. 8–13 are cross sections of intermediate structures formed during an embodiment of the present method which forms a digit line contact and digit line.

FIG. 8 depicts a conductively-doped region 10 within a semiconductor wafer 12, and illustrates a planarized dielectric layer 14 such as one or more layers of borophosphosilicate glass (BPSG) and/or tetraethyl orthosilicate (TEOS) formed on the wafer 12. A hard mask layer 90 is formed over the dielectric, preferably from a material such as amorphous carbon (a-carbon). If required due to reflectance of hard mask 90, a dielectric antireflective coating (DARC) layer 92 is formed over the hard mask layer 90. A patterned photoresist layer 16 is formed on the DARC layer 92, having an opening 94 over a feature 10 under dielectric 14 which is to be exposed.

The target thickness of a-carbon layer 90 is dependent on the width of the opening 94 in resist layer 16, which is related to the desired width of the opening which eventually is formed in dielectric layer 14 during subsequent processing. For an opening 94 in resist layer 16 which is 0.12 microns (μ) or 1,200 angstroms (Å) wide, the a-carbon layer 90 would be preferably between about 100 Å and about 500 Å thick. DARC layer 92 can be manufactured from any suitable antireflective layer, for example from plasma enhanced chemical vapor deposition (PECVD) silicon oxynitride ($SiO_xN_y$) according to means known in the art and will typically be between about 100 Å and about 1,000 Å thick.

An a-carbon layer may be formed by various means, for example using a high-density plasma (HDP) process, a physical vapor deposition (PVD) process, a chemical vapor deposition (CVD) process, or a PECVD process. To form an a-carbon layer using PECVD, a semiconductor wafer is placed into a PECVD chamber, then the chamber is heated to a temperature of between about 300° C. and about 650° C., preferably about 550° C. At temperature, propylene ($C_3H_6$) is introduced into the chamber at a flow rate of between about 300 standard cubic centimeters per minute (sccm) and about 1,500 sccm, preferably about 600 sccm. Optionally, helium (He) may be flowed at a rate of between about 200 sccm and about 2,000 sccm, preferably about 325 sccm. If used, the helium may assist in the formation of a more uniform layer. During the introduction of gasses, the PECVD chamber is subjected to a radio frequency (RF) power of between about 100 watts (W) and about 1,000 W, preferably about 700 W, and a pressure of between about 4.0 torr (T) and about 8.0 T, preferably about 6.0 T. This process forms an a-carbon layer at a rate of about 800 angstroms (Å) per minute to about 5,000 Å (5 KÅ) per minute, depending on the gas flow rates and the rates of the other parameters as described above. Table 1 summarizes these conditions.

TABLE 1

Summary of Variable Ranges to Form an Amorphous Carbon Layer

| Variable | Broad Range | Narrow Range/Typical |
|---|---|---|
| Temperature | 400–650° C. | 550° C. |
| $C_3H_6$ flow rate | 300–1,500 sccm | 600 sccm |
| $B_2H_6$ flow rate | 100–2,000 sccm | 150–1,200 sccm |
| RF Power | 100–1,000 watts | 700 watts |
| Pressure | 4.0–8.0 Torr | 6.0 Torr |
| a-carbon formation rate | 800–5,000 Å/minute | 1,200–3,500 Å/minute |

Figure 9:
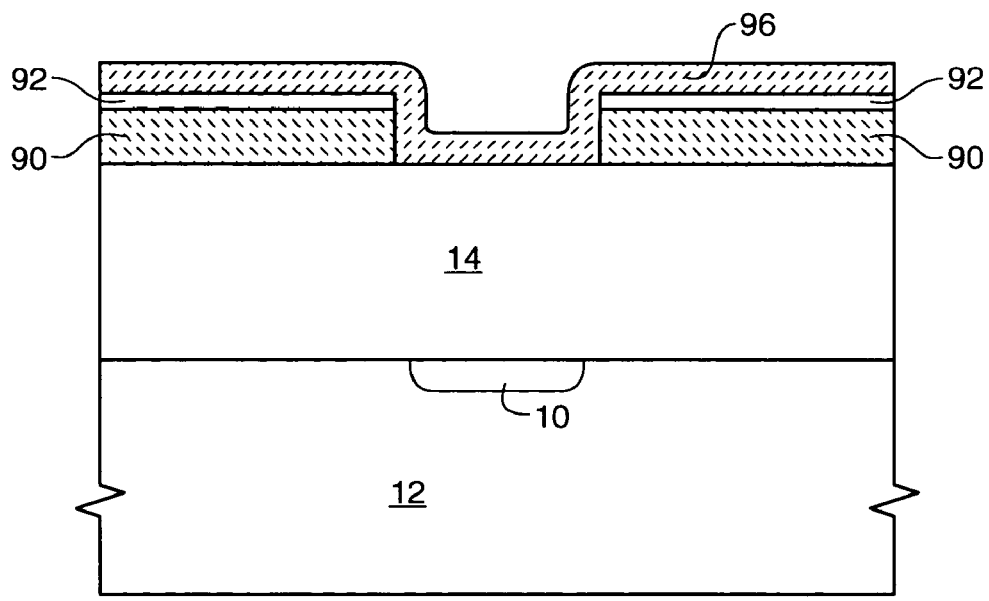

After forming the FIG. 8 structure, the DARC layer 92 and hard mask layer 90 are etched as depicted in FIG. 9 to define an opening to the feature to be exposed which, in the present embodiment, is diffusion region 10. In the present embodiment the opening is formed at the limits allowable by current optical lithography, for example 0.12μ. The DARC layer 92 and the a-carbon layer 90 can be etched using carbon tetrafluoride ($CF_4$) at a flow rate of about 5 sccm, sulfur dioxide ($SO_2$) at a flow rate of about 40 sccm, and oxygen ($O_2$) at a flow rate of about 30 sccm. The rate of removal using this etch will be between about 20 Å/second and about 50 Å/second. After etching the DARC 92 and a-carbon layer 90 to expose the dielectric layer 14, a conformal unetched sacrificial spacer layer 96 is formed to result in the FIG. 9 structure. (It should be noted that as used herein, a "sacrificial layer" is one which may be completely removed during subsequent processing without negatively affecting the functionality of the completed device.) The thickness of the spacer layer will determine the reduction in the width of the opening in dielectric 14 which will expose diffusion region 10. Generally, as the thickness of the spacer layer increases the opening which will expose the diffusion region will decrease in width. With the present embodiment, a spacer layer 96 formed from a-carbon is preferred, between about 100 Å and about 500 Å thick. This a-carbon layer can be formed using the description above for layer 90, adjusting the duration to form a layer having the specified thickness.

Amorphous carbon is specified as a preferred material for both the hard mask 90 and the spacer layer 96 because, unlike silicon nitride, it can be removed using an oxygen plasma process which is highly selective to other materials on the wafer (i.e. the etch removes a-carbon and leaves other exposed materials with little or no etching). This is similar to the removal of photoresist in an oxygen plasma. If silicon nitride were used it would require an additional step for its removal. Further, with the present embodiments, it can be difficult to completely remove silicon nitride, and silicon nitride stringers can easily remain subsequent to etching. To remove the nitride a more aggressive etch would be required which may attack the material at the bottom of the hole, for example silicon of the substrate or polysilicon of exposed conductive features. Unwanted removal of silicon during an aggressive etch of nitride may negatively affect critical dimensions and create electrical problems during functioning of the device.

Figure 10:
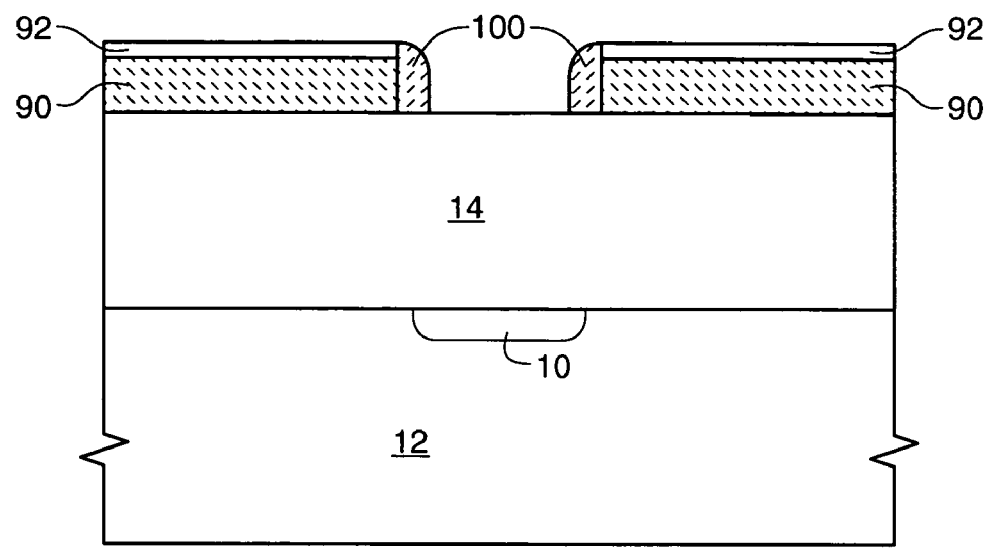

After forming the FIG. 9 structure a spacer etch is performed on layer 96 to result in first and second cross-sectional a-carbon spacers 100 as depicted in FIG. 10 along first and second cross-sectional sidewalls of the a-carbon hard mask 90. A spacer etch of an a-carbon layer may comprise sulfur dioxide ($SO_2$) at a flow rate of between about 20 sccm and about 100 sccm, preferably about 40 sccm and oxygen ($O_2$) at a flow rate of between about 50 sccm and about 200 sccm, preferably about 80 sccm. Chamber pressure is maintained at between about 10 millitorr (mT) and about 30 mT and a temperature of between about 0° C. and about 20° C., for example about 5° C., for a duration of between about 20 seconds and about 200 seconds. During the formation of the a-carbon spacers 100, dielectric layer 14 is preferably exposed as depicted. The DARC 92 layer may also be removed during the spacer etch, or it may be removed during subsequent processing, for example during removal of hard mask layer 90 or during etching of dielectric layer 14.

It should be noted that because the opening in the hard mask layer 90 may be round or oval, the first and second cross-sectional sidewalls depicted in mask layer 90 and the first and second spacers 100 along the sidewalls as depicted in FIG. 10 may be, in actuality, two parts of one continuous sidewall or spacer. These features of this and other embodiments in the description and claims may be described herein as first and second sidewalls or spacers for ease of explanation.

Figure 11:
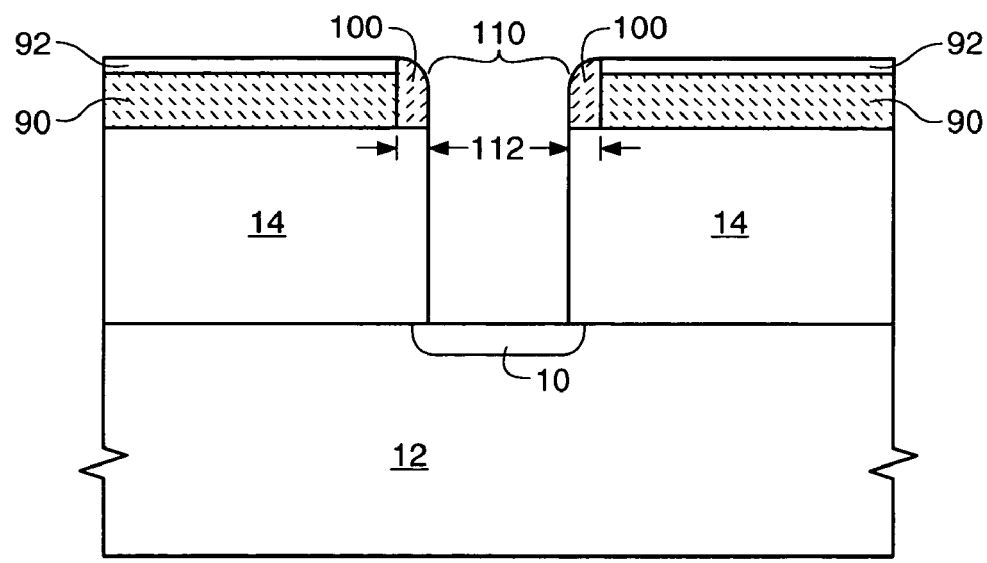

After forming the FIG. 10 structure, the dielectric layer 14 is etched using a vertical anisotropic etch to form a contact opening 110 therein and to expose the diffusion region 10 as depicted in FIG. 11. Vertical anisotropic etches of BPSG and TEOS are well known in the art. The width of the opening 110 is decreased from the width (94 in FIG. 8) in resist layer 16. This decrease is equal to width 94 less the sum of the two widths 112 at the widest part of spacers 100. For the embodiment described above where the opening 94 in resist 16 is 0.12μ, for spacers which are each 0.005μ (50 Å) wide, the opening 110 in dielectric 14 will be about 0.11μ wide. This is an 8% decrease in the minimum feature size of the opening. The opening 110 in layer 14 in the FIG. 11 structure is about equal to the distance from one cross sectional spacer 100 to the other cross sectional spacer 100. The openings are "about equal" as there may be some variation in the etch rates of the material of layers 96 and 14.

Figure 12:
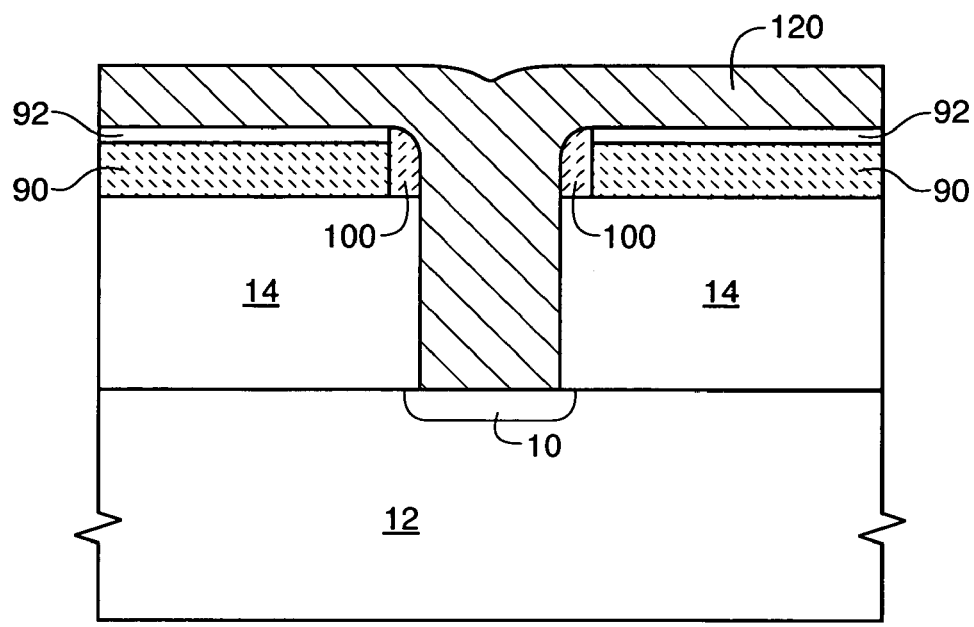
Figure 13:
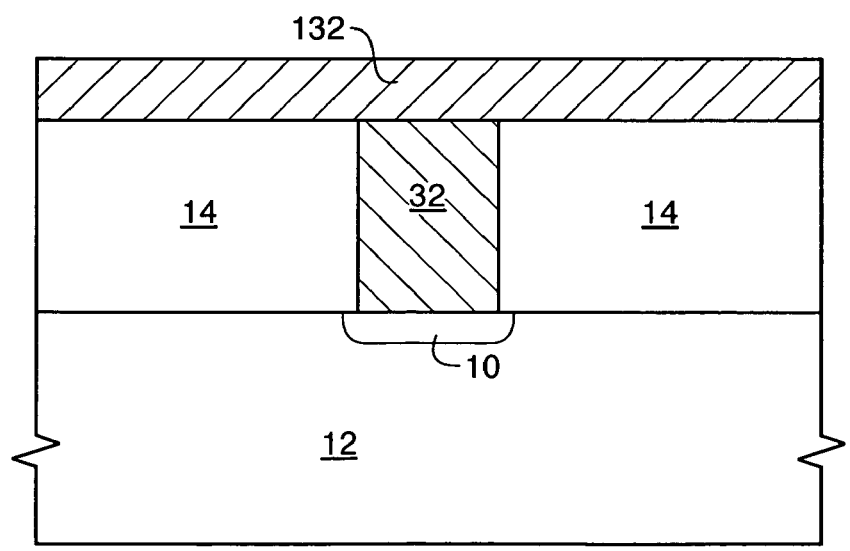

After etching the opening 110 in dielectric 14, a conductive layer 120 such as one or more conductive metal layers is formed in opening 110 to contact diffusion region 10 as depicted in FIG. 12. A planarization is performed on the FIG. 12 structure to remove a-carbon hard mask 90, DARC layer 92, spacers 100, and a portion of layer 120 from the horizontal surface of layer 14, which may also remove a portion of layer 14. This forms a conductive plug 32 within the opening 110 in the dielectric layer 14 as depicted in FIG. 13. In the alternative, layers 90, 92, and 100 can be removed prior to forming layer 120, but this may result in impurities forming within opening 110 which must be removed prior to forming layer 120. In either case, after planarizing layer 120 from the surface of layer 14 to form plug 32, a conductive line 132 is formed as depicted in FIG. 13, for example using a damascene process, or a blanket metal layer may be masked and etched to form the conductive line 132. Wafer processing continues according to means known in the art.

Figure 14:
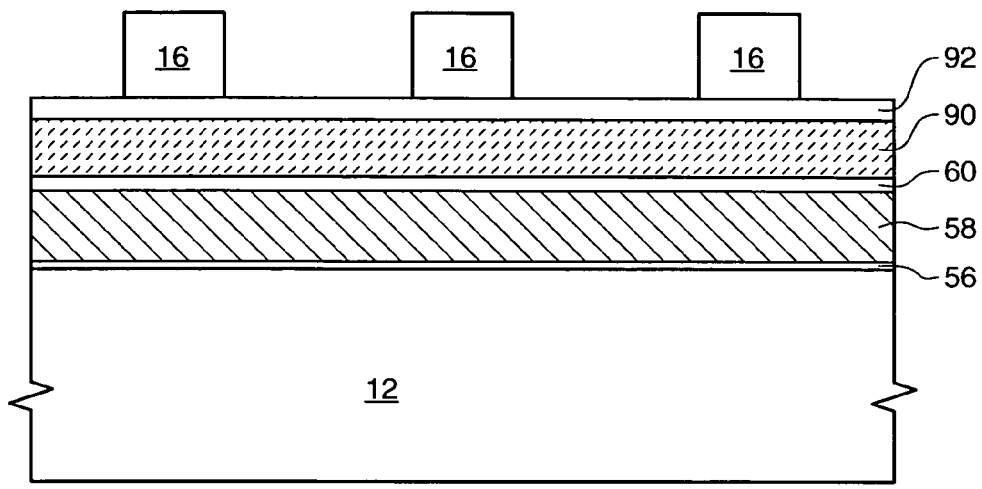
FIGS. 14–19 are cross sections of intermediate structures formed during an embodiment of the present method which forms a flash memory device comprising a floating gate.
Figure 15:
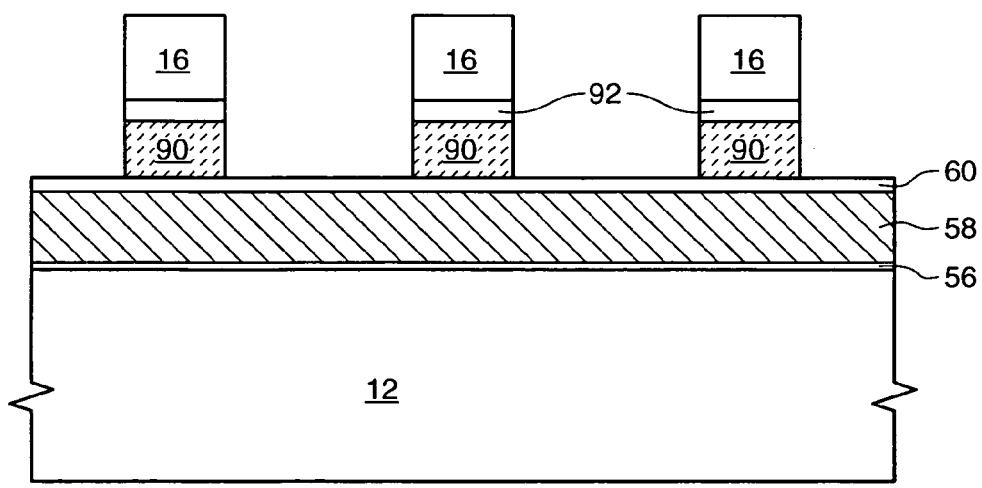

FIGS. 14–19 depict a second embodiment using the inventive method to define a plurality of transistor floating gates having minimal spacing between adjacent floating gates along a word line. FIG. 14 depicts a semiconductor wafer 12, gate oxide 56, floating gate layer 58, for example comprising polysilicon, capacitor dielectric 60, for example comprising a layer of silicon nitride interposed between two silicon dioxide layers (not individually illustrated), a hard mask layer 90 such as an a-carbon layer described above, and, if required, a DARC layer 92. The floating gate layer 58 at the point depicted in FIG. 14 comprises a plurality of parallel bands, one of which is depicted as element 58. These bands of floating gate material will be perpendicular to the word lines. A patterned photoresist layer 16 is formed which will define transistor floating gates. In this particular embodiment, the openings within photoresist layer 16 are formed at the minimum limits allowed by optical lithography.

Figure 16:
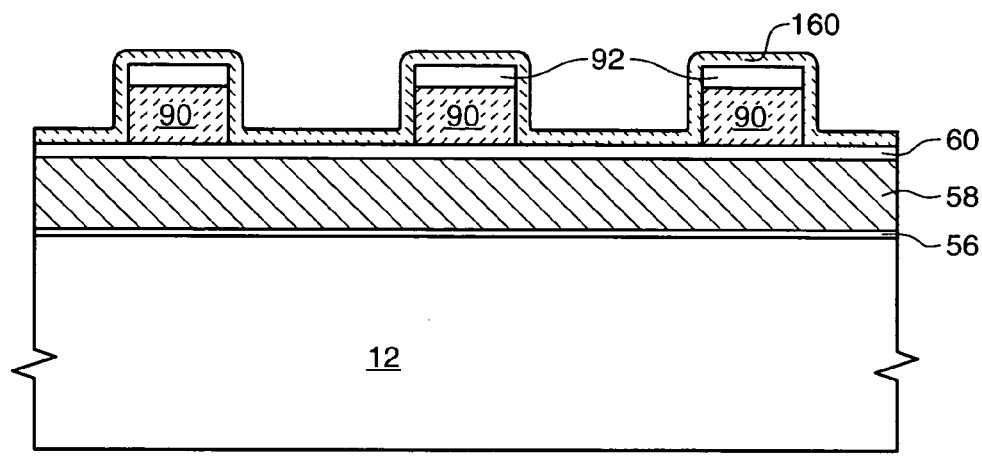
Figure 17:
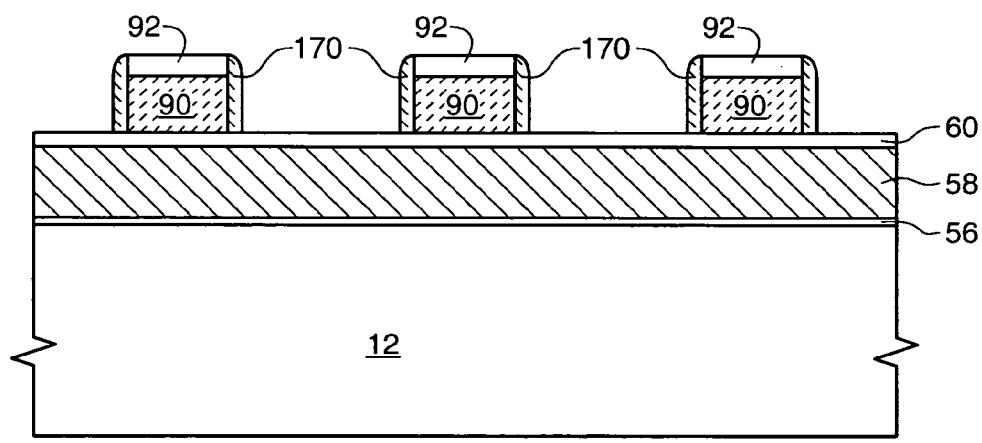

An etch is performed on the FIG. 14 structure to remove exposed portions of the DARC layer 92 and the hard mask layer 90, and to stop on the capacitor dielectric layer 60. This etch results in the FIG. 15 structure. An etch described above for the first embodiment which removes the material of a DARC layer and an a-carbon hard mask selective to a dielectric such as BPSG and/or TEOS would be sufficient. After forming the FIG. 15 structure the photoresist layer 16 is removed according to means known in the art, for example by using an ash process in an oxygen plasma, and a blanket spacer layer 160 is formed over exposed surfaces as depicted in FIG. 16. A spacer layer formed from a-carbon according to the first embodiment above is preferred. After forming the FIG. 16 structure, a vertical anisotropic etch is performed on the spacer layer 160 selective to capacitor dielectric 60 and DARC layer 92, for example using an etch as described for the first embodiment. This forms a-carbon spacers 170 as depicted in FIG. 17 on sidewalls of the a-carbon layer 90 and DARC layer 92.

Figure 1:
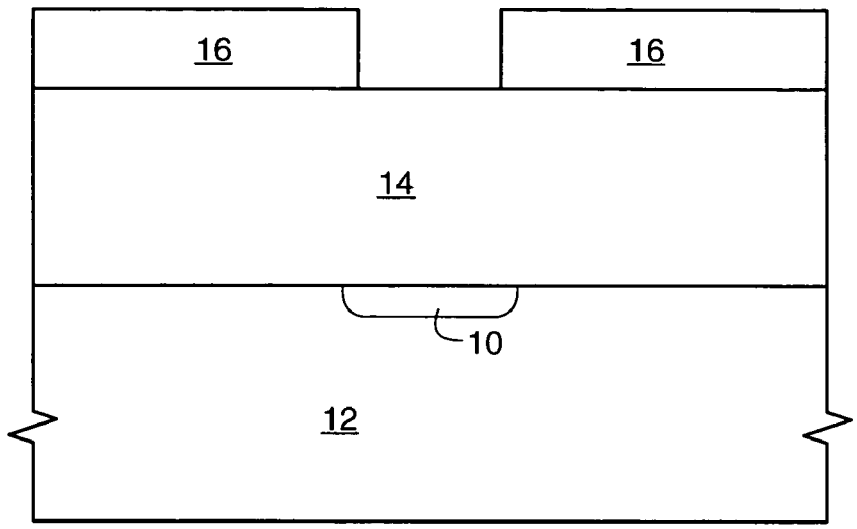
FIGS. 1–4 are cross sections depicting a conventional method for forming a digit line contact and a digit line for a semiconductor device.
Figure 2:
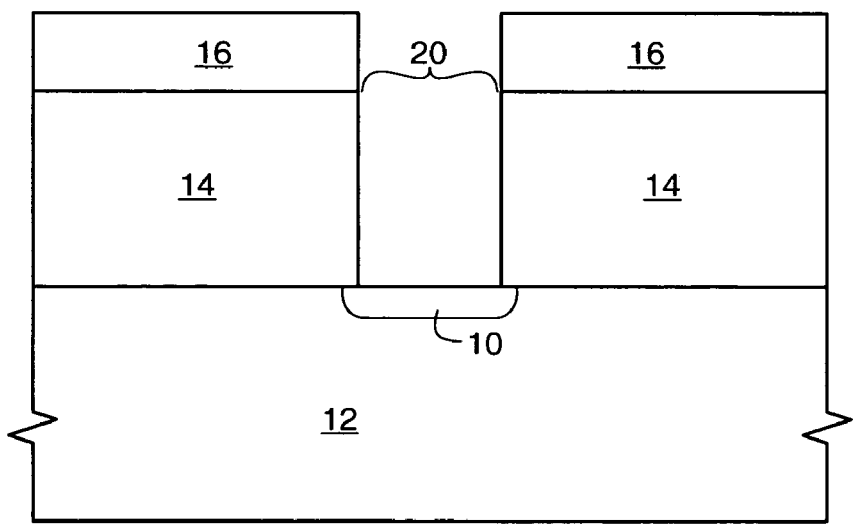
Figure 3:
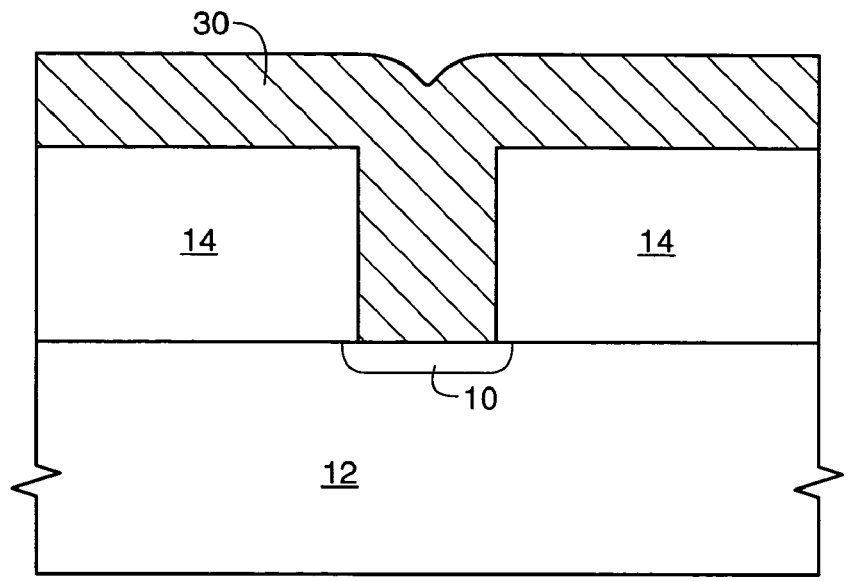
Figure 4:
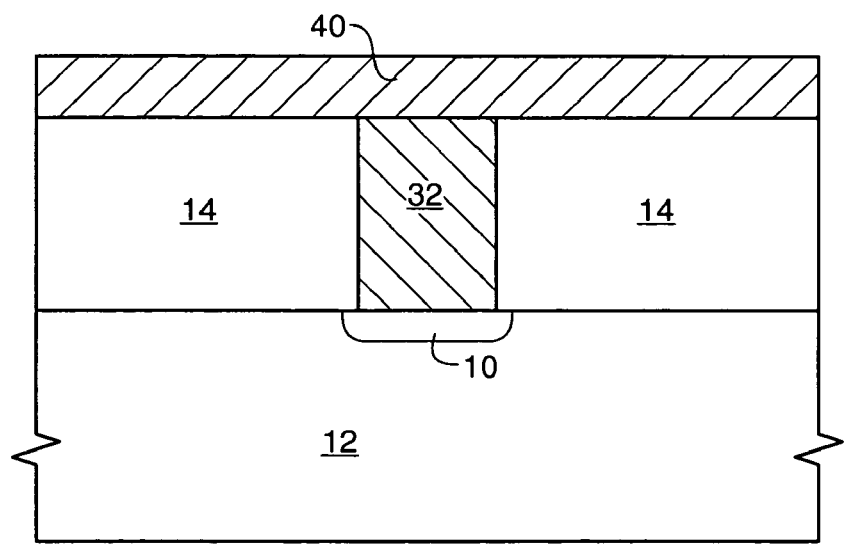
Figure 5:
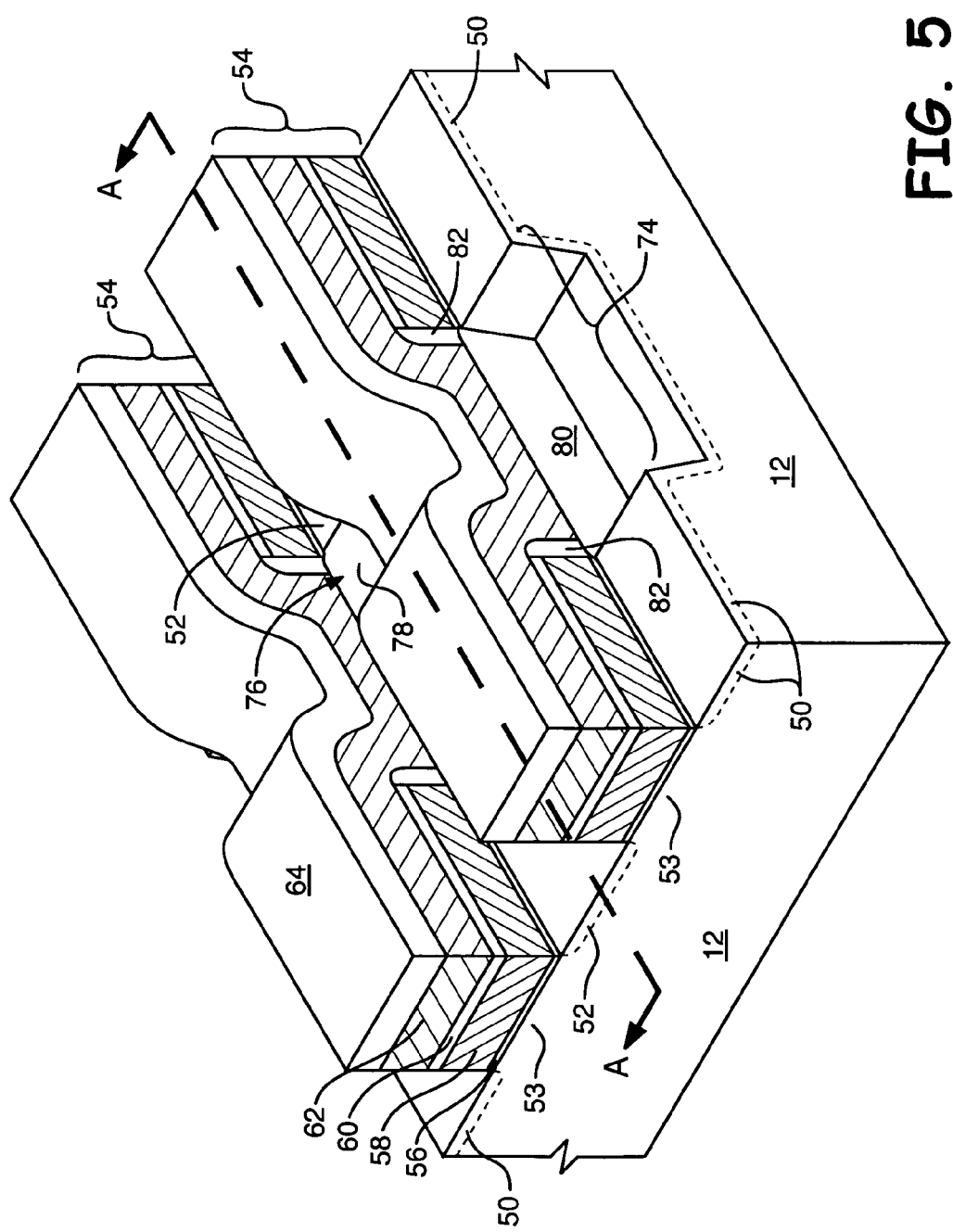
FIG. 5 is an isometric view of part of a conventional in-process flash memory device.
Figure 6:
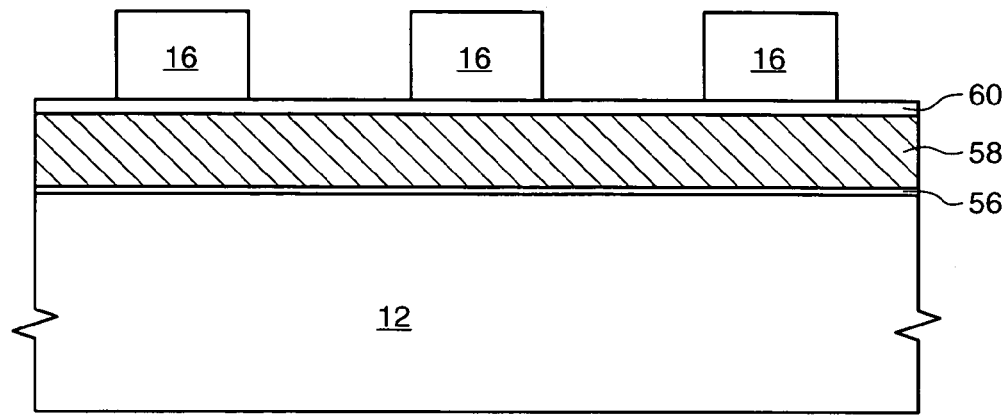
FIGS. 6 and 7 are cross sections of intermediate structures during the conventional formation of the FIG. 5 flash memory device.
Figure 7:
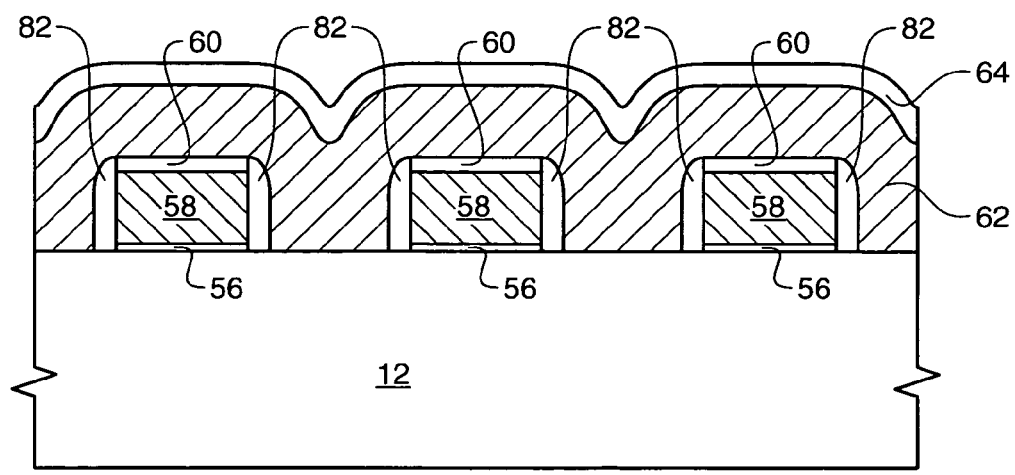
Figure 18:
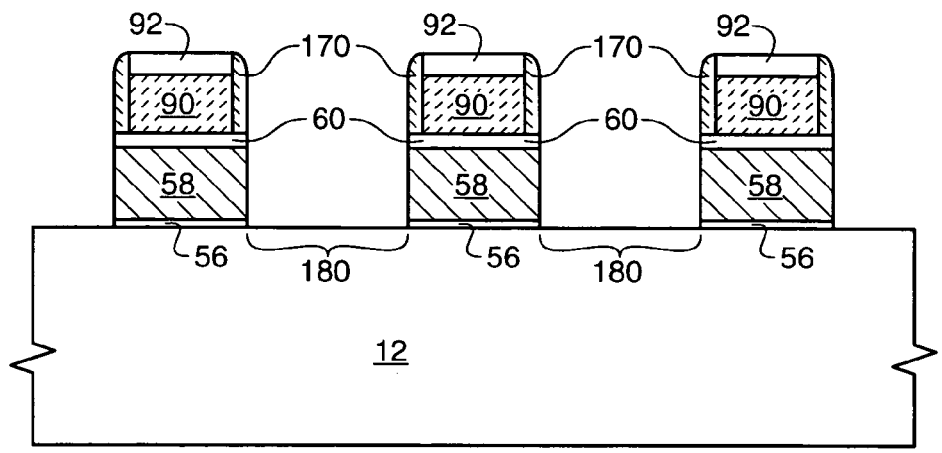

Next, the capacitor dielectric 60, the floating gate layer 58 and at least a portion of the gate oxide 56 is etched to result in the structure of FIG. 18. The spacing 180 between the floating gates 58 of FIG. 18 is narrower than the spacing of conventional floating gates formed using the process depicted in FIGS. 5–7. Further, the floating gates 58 are somewhat larger which results in an increase in the capacitive coupling between the floating gates 58 and the later formed word line.

Figure 19:
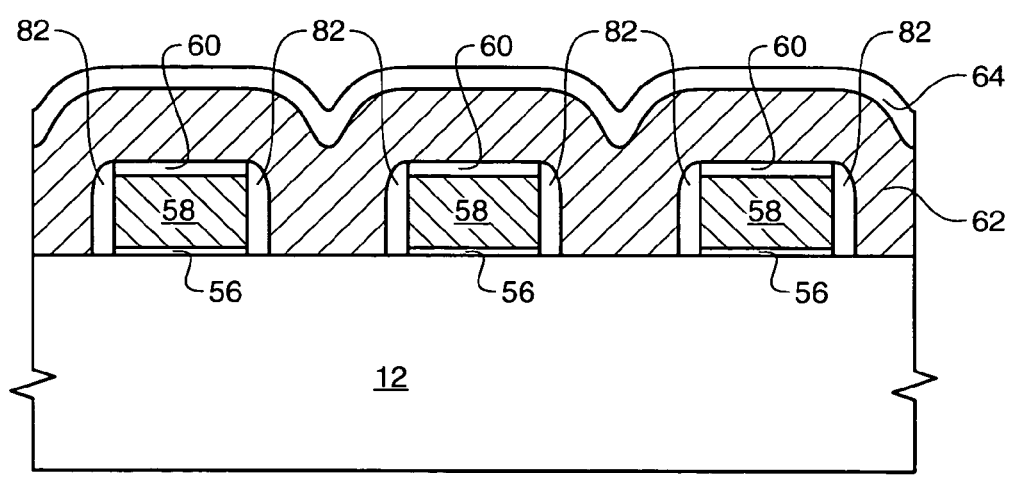

After forming the FIG. 18 structure the a-carbon spacer layer 170, the DARC layer 92 and the a-carbon hard mask layer 90 are removed. A blanket spacer layer such as silicon nitride is formed over exposed surfaces then etched to result in the spacers 82 as depicted in FIG. 19 around the floating gate layer 58. After forming spacers 82, a word line layer such as polysilicon and a capping layer such as silicon nitride are formed over the wafer surface, masked, and etched to form word lines 62 and capping layer 64 as depicted in FIG. 19. Wafer processing then continues according to means known in the art to form a floating gate device such as a flash memory.

Figure 20:
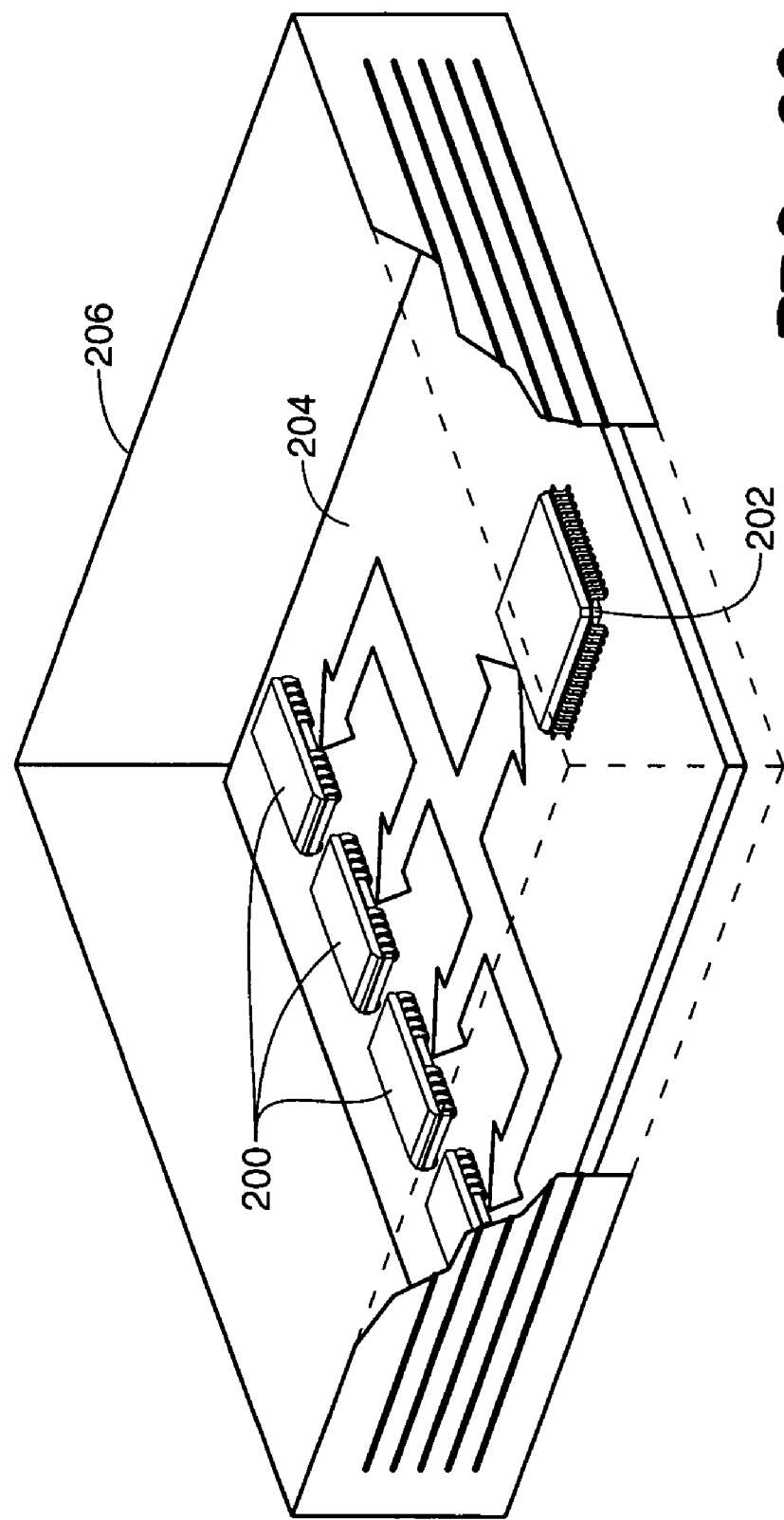
FIG. 20 is an isometric depiction of a use of the invention in an electronic device.

As depicted in FIG. 20, a semiconductor device 200 formed in accordance with the invention may be attached along with other devices such as a microprocessor 202 to a printed circuit board 204, for example to a computer motherboard or as a part of a memory module used in a personal computer, a minicomputer, or a mainframe 206. FIG. 20 may also represent use of device 200 in other electronic devices comprising a housing 206, for example devices comprising a microprocessor 202, related to telecommunications, the automobile industry, semiconductor test and manufacturing equipment, consumer electronics, or virtually any piece of consumer or industrial electronic equipment.

Figure 21:
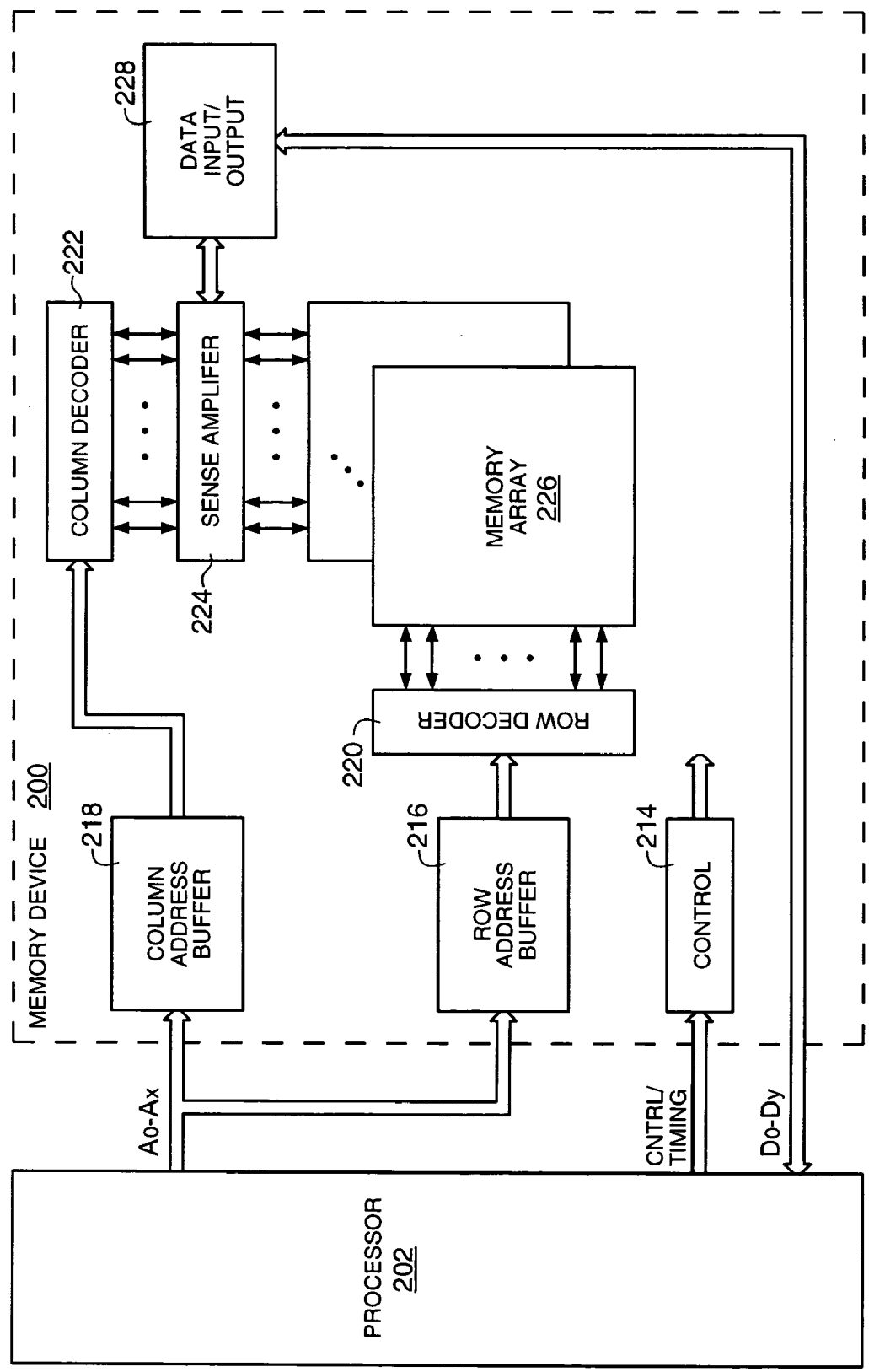
FIG. 21 is a block diagram of an exemplary use of the invention to form part of a transistor array in a memory device.

The process and structure described herein can be used to manufacture a number of different structures which comprise a structure formed using a photolithographic process. FIG. 21, for example, is a simplified block diagram of a memory device such as a dynamic random access memory having digit lines and other features which may be formed using an embodiment of the present invention. The general operation of such a device is known to one skilled in the art. FIG. 21 depicts a processor 202 coupled to a memory device 200, and further depicts the following basic sections of a memory integrated circuit: control circuitry 214; row 216 and column 218 address buffers; row 220 and column 222 decoders; sense amplifiers 224; memory array 226; and data input/output 228.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A method used to form a semiconductor device, comprising:
   forming a layer to be etched;
   depositing a first amorphous carbon layer on the layer to be etched;
   patterning the first amorphous carbon layer to form an opening therein defined by first and second cross-sectional sidewalls of the first amorphous carbon layer;
   depositing a conformal second amorphous carbon layer such that the second amorphous carbon layer contacts the sidewalls of the first amorphous carbon layer;
   spacer etching the second amorphous carbon layer to form first and second cross-sectional spacers, each of which contacts one of the first and second cross-sectional sidewalls of the first amorphous carbon layer;
   subsequent to forming the first and second cross-sectional spacers, etching the layer to be etched using the first and second amorphous carbon layers as a pattern to form an opening in the layer to be etched;
   subsequent to etching the layer to be etched, planarizing the first amorphous carbon layer and the first and second spacers using a mechanical polishing process, wherein the planarizing removes the first amorphous carbon layer and the first and second spacers; and
   forming a conductive layer within the opening of the layer to be etched.

2. A method used to form an opening in a dielectric layer, comprising:
   forming a dielectric layer over a semiconductor wafer substrate assembly;
   depositing a blanket first amorphous carbon layer on the dielectric layer;
   etching the blanket first amorphous carbon layer to form an opening therein defined by first and second cross sectional sidewalls in the first amorphous carbon layer, the opening having a first width, wherein the dielectric layer is exposed by the opening in the first amorphous carbon layer;
   depositing a conformal second amorphous carbon layer which contacts the first and second cross sectional sidewalls in the first amorphous carbon layer;
   etching the second amorphous carbon layer to form first and second cross sectional spacers separated from each other by a second width narrower than the first width, with each spacer contacting one of the first and second cross sectional sidewalls; and
   etching the dielectric layer to form an opening therein defined by first and second cross sectional sidewalls in the dielectric layer, wherein the first and second cross sectional sidewalls in the dielectric layer are separated by a third width about equal to the second width and are generally continuous with an external surface of each spacer.

3. The method of claim 2 wherein the dielectric layer comprises both a silicon dioxide layer and a dielectric antireflective coating (DARC) layer which overlies the silicon dioxide layer.

4. The method of claim 2 further comprising planarizing the first amorphous carbon layer and the spacers to remove the first amorphous carbon layer and the spacers from over the dielectric layer subsequent to forming the opening in the dielectric layer.

5. The method of claim 4 further comprising forming a conductive layer within the opening in the dielectric layer subsequent to planarizing the first amorphous carbon layer and the spacers.

6. The method of claim 4 further comprising:
   forming a conductive layer within the opening in the dielectric layer prior to planarizing the first amorphous carbon layer and the spacers; and
   during the planarizing, planarizing the conductive layer, then planarizing the first amorphous carbon layer and the spacers.

7. The method of claim 2 further comprising:
   providing a conductive feature under the dielectric layer;
   exposing the conductive feature during the etch of the dielectric layer; and
   forming a conductive layer within the opening in the dielectric layer which contacts the conductive feature under the dielectric layer.

8. A method for forming a semiconductor device, comprising:
- forming a conductively-doped blanket floating gate layer over a semiconductor wafer substrate assembly;
- forming a blanket capacitor dielectric on the blanket floating gate layer;
- subsequent to forming the blanket capacitor dielectric, forming a blanket first amorphous carbon layer over the blanket floating gate layer;
- patterning the blanket first amorphous carbon layer to form a plurality of bands of the first amorphous carbon layer, wherein each band of amorphous carbon is separated by an adjacent band of amorphous carbon by an opening having a first width, and wherein each opening in the first amorphous carbon layer is defined by a sidewall of the first amorphous carbon layer;
- forming a blanket second amorphous carbon layer over the first amorphous carbon layer which contacts each the sidewall of the first amorphous carbon layer;
- etching the blanket second amorphous carbon layer to form a plurality of cross sectional spacers, with one spacer formed along each the sidewall of the first amorphous carbon layer, wherein adjacent spacers are separated by a second width which is less than the first width;
- subsequent to forming the plurality of cross sectional spacers, etching the floating gate layer using the first amorphous carbon layer and the spacers as a pattern to form a plurality of bands of conductively-doped floating gate material;
- subsequent to etching the floating gate layer, removing the first amorphous carbon layer and the spacers;
- subsequent to forming the plurality of bands of conductively-doped floating gate material, forming a blanket conductively-doped word line layer over the capacitor dielectric; and
- using a single etch mask, patterning the word line layer, the capacitor dielectric, and the bands of conductively doped floating gate material to form a plurality of word lines and a plurality of rectangular floating gates separated from the word lines by the capacitor dielectric.

9. The method of claim 1 wherein the mechanical polishing process comprises chemical mechanical polishing (CMP).

10. The method of claim 1 further comprising:
- forming the conductive layer over the first amorphous carbon layer and over the first and second cross sectional spacers; and
- removing the conductive layer from over the first amorphous carbon layer during the mechanical polishing process.

* * * * *